United States Patent
She et al.

(10) Patent No.: US 11,691,924 B2
(45) Date of Patent: Jul. 4, 2023

(54) CVI MATRIX DENSIFICATION PROCESS

(71) Applicant: Raytheon Technologies Corporation, Farmington, CT (US)

(72) Inventors: Ying She, East Hartford, CT (US); Nitin Garg, West Hartford, CT (US); Andrew J. Lazur, Laguna Beach, CA (US); Olivier H. Sudre, Glastonbury, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 389 days.

(21) Appl. No.: 16/798,016

(22) Filed: Feb. 21, 2020

(65) Prior Publication Data
US 2021/0261469 A1  Aug. 26, 2021

(51) Int. Cl.
| C04B 35/80 | (2006.01) |
| C04B 35/628 | (2006.01) |
| C23C 16/04 | (2006.01) |
| C23C 16/455 | (2006.01) |

(52) U.S. Cl.
CPC ........ *C04B 35/80* (2013.01); *C04B 35/62863* (2013.01); *C04B 35/62884* (2013.01); *C23C 16/045* (2013.01); *C23C 16/45557* (2013.01); *C04B 2235/3826* (2013.01); *C04B 2235/5244* (2013.01); *C04B 2235/5252* (2013.01); *C04B 2235/614* (2013.01)

(58) Field of Classification Search
CPC ................... C23C 16/45557; C04B 35/62884
See application file for complete search history.

(56) References Cited

U.S. PATENT DOCUMENTS

| 5,079,039 | A | 1/1992 | Heraud et al. |
| 5,480,678 | A | 1/1996 | Rudolph et al. |
| 6,001,419 | A | 12/1999 | Leluan et al. |
| 7,335,397 | B2 | 2/2008 | Rudolph et al. |
| 7,892,646 | B1 * | 2/2011 | Rudolph ............... C23C 16/045 |
| | | | 428/408 |
| 7,959,973 | B2 | 6/2011 | Waghray et al. |
| 8,956,683 | B2 | 2/2015 | Vargas et al. |
| 10,443,124 | B1 | 10/2019 | Purdy et al. |
| 10,450,236 | B2 | 10/2019 | Kirkpatrick et al. |

(Continued)

FOREIGN PATENT DOCUMENTS

FR    3016361 A1    7/2015

OTHER PUBLICATIONS

Naslain et al., "Synthesis of highly tailored ceramic matrix composites by pressure-pulsed CVI," 2001, Solid State Ionics 141-142, pp. 541-548. (Year: 2001).*

(Continued)

*Primary Examiner* — Robert A Vetere
(74) *Attorney, Agent, or Firm* — Cantor Colburn LLP

(57) ABSTRACT

Disclosed herein is a chemical vapor infiltration method including flowing ceramic precursors through a preform and depositing a matrix material on the preform at a first gas infiltration pressure, increasing the gas filtration pressure to a second gas infiltration pressure, and lowering the gas infiltration pressure to a third gas infiltration pressure which is intermediate to the first and second gas infiltration pressures.

16 Claims, 1 Drawing Sheet

(56) References Cited

U.S. PATENT DOCUMENTS 10,465,282 B2 11/2019 Rudolph et al.
2018/0127870 A1 5/2018 Losego et al.

OTHER PUBLICATIONS

European Search Report for European Application No. 21157998.2; Application Filing Date: Feb. 18, 2021; dated Aug. 3, 2021; 7 pages.
European Office Action for EP Application No. 21157998.2 dated Mar. 21, 2023, pp. 1-5.

\* cited by examiner

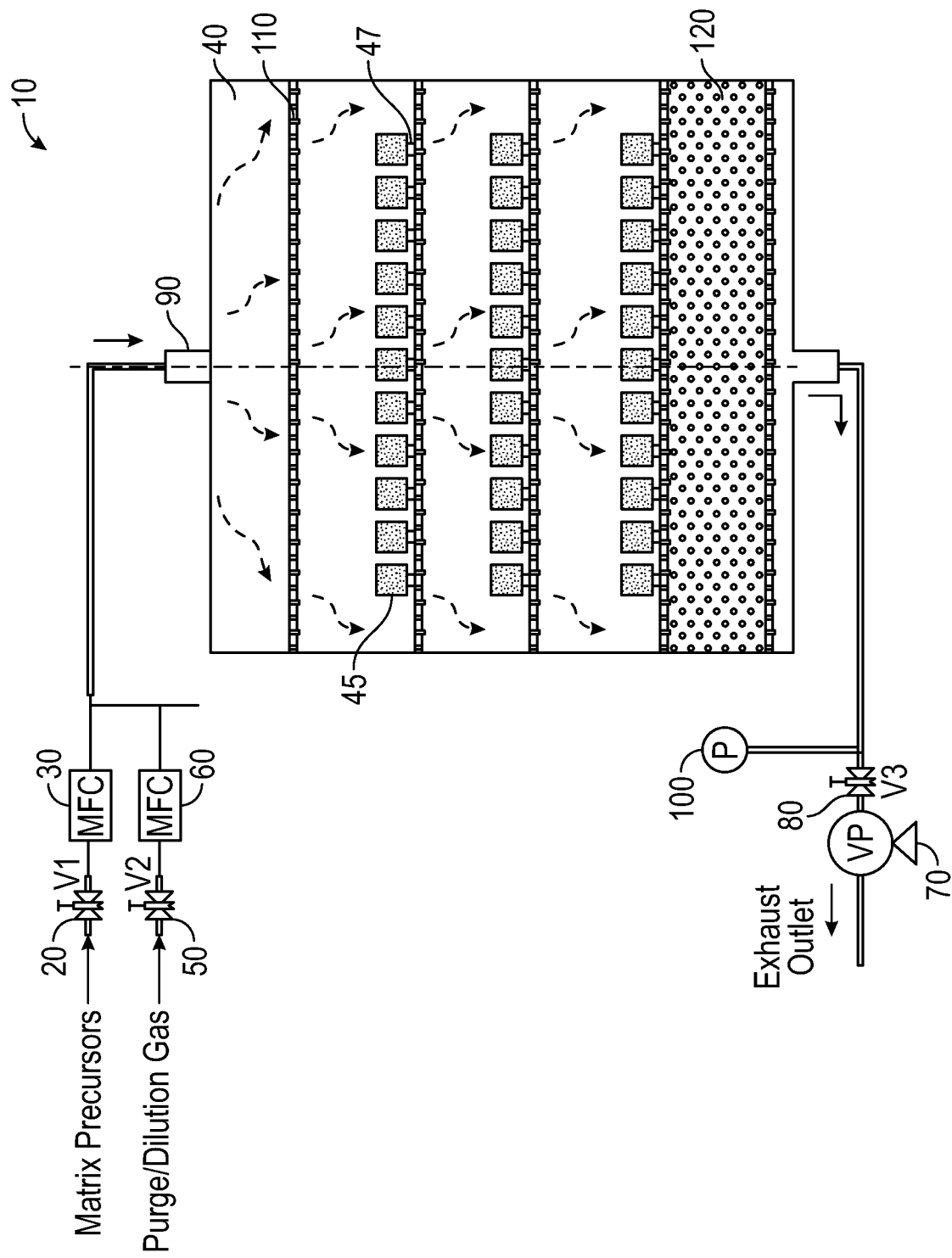

CVI MATRIX DENSIFICATION PROCESS

BACKGROUND

Exemplary embodiments pertain to the art of chemical vapor infiltration.

Deposition of solid phases on substrates by decomposition of volatile or gaseous compounds which contain the solid phase elements is generally referred to as chemical vapor deposition. If this deposition takes place in the open pores of a porous substrate or in the cavities of a porous structure, then it is often referred to as chemical vapor infiltration. Chemical vapor deposition (CVD) and chemical vapor infiltration (CVI) allow a densification of structure or, when the porous structure consists of fibers, an introduction of a matrix and, with this, the production of composite material. Both chemical vapor deposition as well as chemical vapor infiltration are extremely complex processes.

In chemical vapor infiltration, the volatile or gaseous precursors must be transported into the depths of the pores before conversion to the solid matrix. If decomposition of the volatile or gaseous precursors, and formation of the solid phase, occurs in the gas phase and on the surface of the porous structure in or near the entrances of the pores, the pores can become clogged. The interior pores are then not filled, resulting in a composite with uneven density. Improved methods to address this issue are desired.

BRIEF DESCRIPTION

Disclosed is a chemical vapor infiltration method including flowing ceramic precursors through a preform and depositing a matrix material on the preform at a first gas infiltration pressure, increasing the gas filtration pressure to a second gas infiltration pressure, and lowering the gas infiltration pressure to a third gas infiltration pressure which is intermediate to the first and second gas infiltration pressures.

In addition to one or more of the features described above, or as an alternative to any of the foregoing embodiments, the first pressure is less than or equal to 1 torr. The first pressure may be 0.01 torr to 1 torr.

In addition to one or more of the features described above, or as an alternative to any of the foregoing embodiments, the second pressure is greater than 1 torr. The second pressure may be 1 torr to 100 torr.

In addition to one or more of the features described above, or as an alternative to any of the foregoing embodiments, the first pressure is 1 to 20% of the second pressure.

In addition to one or more of the features described above, or as an alternative to any of the foregoing embodiments, the third pressure is 25 to 75% of the second pressure.

In addition to one or more of the features described above, or as an alternative to any of the foregoing embodiments, the method further includes a fourth pressure intermediate to the first and third pressures.

In addition to one or more of the features described above, or as an alternative to any of the foregoing embodiments, the third pressure maintains matrix deposition under reaction control.

In addition to one or more of the features described above, or as an alternative to any of the foregoing embodiments, the second pressure is maintained until infiltration gas diffusion rate controls matrix densification rate.

In addition to one or more of the features described above, or as an alternative to any of the foregoing embodiments, the preform includes $Al_2O_3$—$SiO_2$, SiC, silicon dioxide ($SiO_2$), aluminum silicate, aluminum oxide ($Al_2O_3$), titanium oxide ($TiO_2$), zirconium silicate, silicon nitride, boron nitride (BN), carbon (C), and combinations thereof.

In addition to one or more of the features described above, or as an alternative to any of the foregoing embodiments, the matrix includes metal oxides, borides, carbides, nitrides, silicides, and mixtures and combinations thereof.

In addition to one or more of the features described above, or as an alternative to any of the foregoing embodiments, the matrix includes silicon carbide (SiC), silicon oxide ($SiO_2$), boron nitride (BN), boron carbide ($B_4C$), aluminum oxide ($Al_2O_3$), zirconium oxide ($ZrO_2$), zirconium boride ($ZrB_2$), zinc oxide ($ZnO_2$) molybdenum disulfide ($MoS_2$), silicon nitride ($Si_3N_4$), and combinations thereof.

In addition to one or more of the features described above, or as an alternative to any of the foregoing embodiments, the method may further include modifying the temperature, precursor flow rate or both.

Also disclosed is a chemical vapor infiltration method including flowing SiC ceramic precursors through a SiC preform and depositing a SiC matrix on the preform at a first gas infiltration pressure, increasing the gas filtration pressure to a second gas infiltration pressure, and lowering the gas infiltration pressure to a third gas infiltration pressure which is intermediate to the first and second gas infiltration pressures.

In addition to one or more of the features described above, or as an alternative to any of the foregoing embodiments, the first pressure may be 0.01 torr to 1 torr.

In addition to one or more of the features described above, or as an alternative to any of the foregoing embodiments, the second pressure is 1 torr to 100 torr.

In addition to one or more of the features described above, or as an alternative to any of the foregoing embodiments, the first pressure is 1 to 20% of the second pressure.

In addition to one or more of the features described above, or as an alternative to any of the foregoing embodiments, the third pressure is 25 to 75% of the second pressure.

In addition to one or more of the features described above, or as an alternative to any of the foregoing embodiments, further including a fourth pressure intermediate to the first and third pressures.

BRIEF DESCRIPTION OF THE DRAWINGS

The following descriptions should not be considered limiting in any way. With reference to the accompanying drawings, like elements are numbered alike:

The FIGURE is a schematic of a CVI apparatus.

DETAILED DESCRIPTION

A detailed description of one or more embodiments of the disclosed apparatus and method are presented herein by way of exemplification and not limitation with reference to the FIGURE.

Various conventional methods for CVI processing are known. Procedurally, the simplest methods to perform are isobaric and isothermic chemical vapor infiltrations. In these conventional methods, the entire process space exists at constant temperature and pressure. Here, however, only very low pressures or partial pressures of reactant gases can be used, when necessary with addition of inert or dilution gases, so that extremely long infiltration times are required. Optimal or maximal pore filling is generally thought to be possible only at extremely slow deposition rates with high infiltration.

The FIGURE shows a schematic of CVI apparatus 10. The CVI reactor 40 has several levels, and each level is loaded with porous preforms 45 separated by porous spacers 47. The process starts by introducing an inert purge or dilution gas (for example, $N_2$) from the inlet 90 on the top of the reactor 40 by opening valves 50 and 80, but valve 20 remains closed while the reactor is being heated to a desirable temperature and pumped down to a set vacuum level. Once the temperature and pressure are achieved, the matrix precursor gas mixture can flow in the furnace at a flow rate by opening valve 20 and closing valve 50 to start densifying porous preforms. The apparatus also includes mass flow controllers 30 and 60, vacuum pump 70, pressure transducer 100, gas distributor 110 and depletion bed 120.

In order to successfully bring about infiltration, low pressures, in particular, low partial pressures of reactant gases, have been used. The pressures realized under the conditions of industrially applied chemical vapor infiltration are at least one to two orders of magnitude below normal pressure. Starting compounds are partially mixed with inert gases so that their partial pressures, and with it their deposition rates, can be further lowered. Due to the low partial pressures, extremely long infiltration times of up to several weeks are required and uneven densification may still occur.

Disclosed herein is a CVI method including flowing ceramic precursors through a preform at a first gas infiltration pressure, increasing the pressure to a second gas infiltration pressure, and lowering the pressure to a third gas infiltration pressure which is intermediate to the first and second gas infiltration pressures.

The gas infiltration pressure during the chemical vapor infiltration is initially set at a very low pressure (a first pressure), typically less than or equal to 1 torr, or, more specifically, 0.01 torr to 1 torr, to facilitate an even and uniform initial deposition of the matrix on the preform for a short period of time. For example, the pressure may remain at the first pressure for 1 minute to 60 minutes. This initial deposition may help reduce stacking faults in the subsequent matrix densification process. The gas infiltration pressure is then raised to a pressure greater than or equal to 1 torr, more specifically 1 to 100 torr (a second pressure). The second pressure is greater than the first pressure. The second pressure is maintained until a time at which infiltration gas diffusion rate rather than deposition rate begins to control the matrix densification rate. At this point the gas infiltration pressure is reduced to a third pressure to maintain the matrix densification under reaction control rather than diffusion control. The third pressure is intermediate to the first and second pressures. By employing a third pressure which is less than the second pressure the diffusion rate is increased—facilitating the deposition in interior spaces, limiting the potential for clogging the surface pores, and facilitating more even matrix deposition.

The first pressure may be 1 to 20% of the second pressure. The third pressure may be 25 to 75% of the second pressure. The third pressure is greater than the first pressure. It is further contemplated that a fourth pressure may be useful. The fourth pressure would be intermediate to the first pressure and the third pressure. The relationship between the pressures can be shown as: first pressure<fourth pressure<third pressure<second pressure.

The time at which the gas infiltration pressure is changed can be determined by modeling or empirically. In some embodiments the change in gas infiltration pressure can be based on the reduction of pore size at the surface, based on the decrease in overall porosity, in response to a decrease in the rate of weight increase, or a combination of two or more of the foregoing. For example, the increase in gas infiltration pressure from the first pressure to the second pressure can be based on a reduction in pore size while the decrease in pressure from the second pressure to the third pressure can be based on a decrease in the rate of weight increase.

The preform includes reinforcing fibers. Exemplary reinforcing fibers include $Al_2O_3$—$SiO_2$, SiC, silicon dioxide ($SiO_2$), aluminum silicate, aluminum oxide ($Al_2O_3$), titanium oxide ($TiO_2$), zirconium silicate, silicon nitride, boron nitride (BN), carbon (C), and combinations thereof. The fibers may include an interphase coating. The preform may be in any of a number of forms, shapes or sizes depending largely on the matrix material, the geometry of the composite product, and the desired properties sought for the end product, and most typically are in the form of whiskers and fibers. The fibers can be discontinuous (in chopped form as staple) or in the form of a single continuous filament or as continuous multifilament tows. They also can be in the form of two- or three-dimensional materials such as a uniaxial fiber layup, a 2D woven fabric layup, 3D weave or a combination thereof.

Exemplary ceramic matrix materials include metal oxides, borides, carbides, nitrides, silicides, and mixtures and combinations thereof. More specifically ceramic matrix materials include silicon carbide (SiC), silicon oxide ($SiO_2$), boron nitride (BN), boron carbide ($B_4C$), aluminum oxide ($Al_2O_3$), zirconium oxide ($ZrO_2$), zirconium boride ($ZrB_2$), zinc oxide ($ZnO_2$) molybdenum disulfide ($MoS_2$), silicon nitride ($Si_3N_4$), and combinations thereof. In some embodiments the ceramic matrix material includes silicon carbide, boron nitride or silicon doped boron nitride. Overall, the $2^{nd}$ and $3^{rd}$ pressures are chosen to keep the matrix densification under kinetic control to have desirable infiltration process during the entire densification process. These pressures depend primarily on kinetics of precursors, preform geometry, etc. To achieve that, other process parameters such as temperature and precursor flow rates can also be altered along with the $2^{nd}$ and $3^{rd}$ pressures. Precursors to these ceramic matrix materials are known and can be determined by one of skill in the art. For example, carbosilanes (sometimes referred to as silanes) and halocarbosilanes are useful precursors for silicon carbide and silazanes and halosilazanes are useful precursors for silicon nitride.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A chemical vapor infiltration method comprising:
   flowing ceramic precursors through a preform in a reactor and depositing a matrix material on the preform at a first gas infiltration pressure of the reactor,
   increasing the gas filtration pressure to a second gas infiltration pressure, and
   lowering the gas infiltration pressure to a third gas infiltration pressure which is intermediate to the first and second gas infiltration pressures;
   wherein the first pressure is less than or equal to 1 torr, and wherein the first pressure is 1 to 20% of the second pressure;
   wherein the second pressure is greater than 1 torr, and wherein the second pressure is maintained until infiltration gas diffusion rate rather than deposition rate controls matrix densification rate; and
   wherein the third pressure is 25 to 75% of the second pressure, and wherein the third pressure maintains matrix densification under reaction control rather than diffusion control.

2. The method of claim 1, wherein the first pressure is maintained at the first pressure for one minute to 60 minutes.

3. The method of claim 1, wherein the first pressure is 0.01 torr to 1 torr.

4. The method of claim 1, wherein the second pressure is greater than 1 torr to 100 torr.

5. The method of claim 1, further comprising a fourth pressure intermediate to the first and third pressures.

6. The method of claim 1, wherein the increase in gas infiltration pressure from the first gas infiltration pressure to the second gas infiltration pressure is based on a reduction in pore size, and the decrease in gas infiltration pressure from the second gas infiltration pressure to the third gas infiltration pressure is based on a decrease in a rate of weight increase.

7. The method of claim 1, wherein the preform comprises $Al_2O_3$—$SiO_2$, SiC, silicon dioxide ($SiO_2$), aluminum silicate, aluminum oxide ($Al_2O_3$), titanium oxide ($TiO_2$), zirconium silicate, silicon nitride, boron nitride (BN), carbon (C), and combinations thereof.

8. The method of claim 1, wherein the matrix comprises metal oxides, borides, carbides, nitrides, silicides, and mixtures and combinations thereof.

9. The method of claim 8, wherein the matrix comprises silicon carbide (SiC), silicon oxide ($SiO_2$), boron nitride (BN), boron carbide ($B_4C$), aluminum oxide ($Al_2O_3$), zirconium oxide ($ZrO_2$), zirconium boride ($ZrB_2$), zinc oxide ($ZnO_2$) molybdenum disulfide ($MoS_2$), silicon nitride ($Si_3N_4$), and combinations thereof.

10. The method of claim 1, further comprising modifying the temperature, precursor flow rate or both.

11. A chemical vapor infiltration method comprising:
    flowing SiC ceramic precursors through a SiC preform in a reactor and depositing a SiC matrix material on the preform at a first gas infiltration pressure of the reactor,
    increasing the gas filtration pressure to a second gas infiltration pressure, and
    lowering the gas infiltration pressure to a third gas infiltration pressure which is intermediate to the first and second gas infiltration pressures;
    wherein the first pressure is less than or equal to 1 torr, and wherein the first pressure is 1 to 20% of the second pressure;
    wherein the second pressure is greater than 1 torr, and wherein the second pressure is maintained until infiltration gas diffusion rate rather than deposition rate controls matrix densification rate; and
    wherein the third pressure is 25 to 75% of the second pressure, and wherein the third pressure maintains matrix densification under reaction control rather than diffusion control.

12. The method of claim 11, wherein the first pressure is 0.01 torr to 1 torr.

13. The method of claim 11, wherein the second pressure is greater than 1 torr to 100 torr.

14. The method of claim 11, wherein the increase in gas infiltration pressure from the first gas infiltration pressure to the second gas infiltration pressure is based on a reduction in pore size, and the decrease in gas infiltration pressure from the second gas infiltration pressure to the third gas infiltration pressure is based on a decrease in a rate of weight increase.

15. The method of claim 11, wherein the first pressure is maintained at the first pressure for one minute to 60 minutes.

16. The method of claim 11, further comprising a fourth pressure intermediate to the first and third pressures.

* * * * *